United States Patent
Santos

(10) Patent No.: US 8,179,150 B2
(45) Date of Patent: May 15, 2012

(54) MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR

(76) Inventor: Eduardo Pedrosa Santos, Atibaia/ SP (BR)

( * ) Notice: Subject to any disclaimer, the term of this patent is extended or adjusted under 35 U.S.C. 154(b) by 435 days.

(21) Appl. No.: 12/531,610

(22) PCT Filed: Mar. 3, 2008

(86) PCT No.: PCT/BR2008/000056
§ 371 (c)(1),
(2), (4) Date: Sep. 16, 2009

(87) PCT Pub. No.: WO2008/113142
PCT Pub. Date: Sep. 25, 2008

(65) Prior Publication Data
US 2010/0097076 A1    Apr. 22, 2010

(30) Foreign Application Priority Data
Mar. 20, 2007  (BR) ...................................... 0700841

(51) Int. Cl.
*G01N 27/00*   (2006.01)

(52) U.S. Cl. ......... 324/658; 324/600; 324/622; 361/181
(58) Field of Classification Search .................. None
See application file for complete search history.

(56) References Cited

U.S. PATENT DOCUMENTS 5,389,884 A * 2/1995 Nakamura et al. ............ 324/663
6,255,935 B1 * 7/2001 Lehmann et al. ................. 307/3

* cited by examiner

*Primary Examiner* — Jermele M Hollington
*Assistant Examiner* — Trung Nguyen
(74) *Attorney, Agent, or Firm* — McKee, Voorhees & Sease, P.L.C.

(57) ABSTRACT

Monitoring system in real time of the state of capacitance graded bushings of power transformers, powers reactors, current transformers, circuit breakers and similar, it is applied preferentially by power transformers; power reactors; chain transformers, circuit breakers and similar, being the system passible of accomplish the monitoring in real time of capacitance graded bushings (1), each one resulted from a capacitive "tap" to which connects a "tap" adapter (3) that, then, connects to a measuring module (4) which receives signals coming from capacitive "tap" (2) of three graded bushings (1) which form a triphase group. One or more measuring modules (4) can, if connect to an only interface man-machine module (5), by means of a serial communication (6), forming a modular system.

24 Claims, 1 Drawing Sheet

Figure 1:
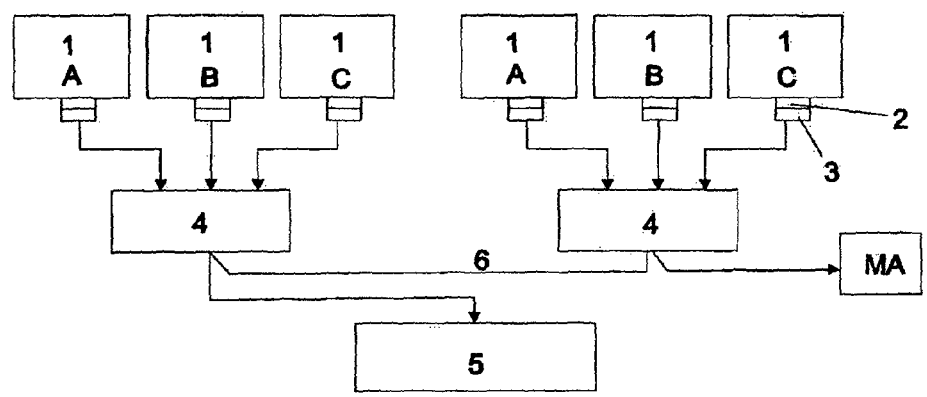

MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR

BRIEF INTRODUCTION

The present Patent of Invention solicitation refers to a new "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR"; notedly of a system that allows the monitoring in real time of capacitance graded bushings, being each one of the referred graded bushings provided with a capacitive "tap", to which join a "tap" adapter that then it is connected to a measuring module that receives the signals in real time coming from capacitive "tap" of three graded bushings (triphase). Thus one or more measuring modules can connect to an only module of interface man-machine by means of serial communication, generating a modular system.

BACKGROUND OF THE INVENTION

The capacitance graded bushings or condensive graded bushings are accessories applied in high and extra-high tension equipment, such as power transformers, derivation reactors, chain transformers and circuit breakers. Despite, in general, the cost of the referred graded bushings is not representative regarding the total price of the equipment to which is maid, a failure in its operation, as, for instance, an isolation failure, can elapse in serious damages, or even in the total loss of the equipment in which is maid.

The condensive graded bushings receive this denomination due to its constructive form, which origin a capacitance between your central conductor and the land. Once the graded bushing is energized, this capacitance allows the passage of a capacitive current to the land, advanced in 90° regarding the tension. Dielectric losses, generally measured through the tangent delta parameters or power factor, give origin to a resistive current, in phase with tension. The sum of these two components, capacitive and resistive, gives origin to the chain of escape of isolation.

Thus, any alteration in the two main parameters of isolation of the graded bushing, which are the capacitance and the dielectric losses, it causes a corresponding change in the escape chain (capacitive and resistive components respectively); what allows the monitoring systems, by means of the measuring of the escape chain, detecting in real time alterations in isolation of the graded bushing, be in the capacitance or in the tangent delta, avoiding thus catastrophic failures.

Associate to this aspect, other technical usually used in the processing of the measuring is the vectorial sum of the escape chains of a triphase group of graded bushings. This technical is based on the fact that any alteration in one of the escape chains of a joint triphase of graded bushings reflects equally in the summing. With that, it improves the measuring sensibility, become possible the same detection of small variations in isolation. With this technical, it is possible to measure only the alterations occurred in the capacitance and in the tangent delta, being necessary that the initial values of capacitance and tangent delta are programmed in the monitoring system, measured by off-line conventional techniques at the moment of the installation of monitoring system in real time.

Other characteristic of the vectorial sum technique of the escape chains are that, to make the referred sum, it is necessary that three graded bushings of a triphase system are connected to the monitoring system in real time and, when initiating its operation the system needs to pass by a "learning" period, during which the characteristics of graded bushings and of the electric system will be observed.

STATE OF TECHNIQUE

Actually, monitoring systems in real time are constituted of a hardware in which are integrated both chain measuring circuits of escape of three graded bushings and interfaces for users (displays; exit contacts; analogical exits; communication doors; etc.), what brings the following inconvenient:
  User should specify in the acquisition of such hardware the total quantity of graded bushings to be monitored, as, for instance, if three, six or nine graded bushings;
  In case there is need to future expansion in the sense of adding new graded bushings, the original hardware will have to be changed.

For using the principle of the vectorial sum of the escape chains, when applied to banks composed of monophase transformers, the existing systems of monitoring in real time need to receive the signals of escape chains coming from three distinct monophase transformers. These transformer banks frequently have a fourth reserve monophase unit, which enters in operation just in case of problems or maintenance in one of three phases. It that occurs, existing monitoring systems present next disadvantages:
  Even between graded bushings of identical production there are variations in the capacitance and tangent delta values, so that the system needs to be parameterized again, informing the initial values of capacitance and tangent delta of the graded bushing of the reserve unit that sometimes enters in operation;
  By the same reason above, it is necessary readjust the alarm values for capacitance and high tangent delta referred to this graded bushing that enters in operation;
  It is necessary to order manually that is remade the learning of the system, considering that a new graded bushing with different characteristics is entering in operation.

Monitoring systems in real time of capacitance and tangent delta of graded bushings have limit values fittings for these parameters. If overtaken such limits, the system emits alarms indicating deteriorization occurrence in some of graded bushings. These limit values fittings can be divided into two distinct levels; a first indicating that the parameter, capacitance or tangent delta reached a high value and a second level indicating that it was reached a very high value. Thus, there are four distinct alarms for each graded bushing: high capacitance; very high capacitance; high tangent delta and very high tangent delta. Like the capacitance and tangent delta values introduce variation of a graded bushing for another, these alarm fittings have to be calculated and fitted individually, in other words, for each graded bushing, resulting in a number of fittings to be made alike to the number of graded bushings multiplied by four. With that, the alarms adjustment process in monitoring systems of existing graded bushings becomes lasting and subject to human failure.

Capacitive "tap" of the graded bushings, where are connected monitoring systems in real time, can also be used for the connection of the denominated "Devices of Potential of Graded bushing" (DPB). These DPB's are used mostly for measuring functions of the phase tensions (neutral phase), and for that have internal circuits that convert the signals of chain and tension present in capacitive "tap" in an alternated tension exit, generally of the order of 115 volts, proportional to the tension with which is energized the graded bushing, being this relation of proportionality denominated of transformation of the device relation, which acts in this case of similar form to a TP (potential transformer). Occurs that, in the cases in which "Tap" of the graded bushing is used to the connection of DPB, becomes unviable the utilization of this same "tap" for connection of the graded bushings monitoring system. In these cases, existing monitoring systems have the disadvantage of forcing the user to opt for maintaining DPB and not to install monitoring system in real time; or to install monitoring system and to leave DPB, replacing it for an external TP, of cost much more elevated.

During the operation of the graded bushing, when this is energized, in most cases it is compulsory that its capacitive "tap" is landed, because otherwise the tension divisor formed by the capacitances of the graded bushing would generate in the "tap" a very elevated tension, superior to its isolation capacity. When of the installation of monitoring systems in real time, that landing of "tap" is left and it is inserted in its place the connection with the chain measuring circuit of escape, so that "tap" continues landed, but now through the measuring circuits of monitoring system in real time. With that is increased the risk of capacitive "tap" is open during the operation of the graded bushing, because the landing that it was before accomplished of located way in "tap" of the graded bushing now it is effected by means of threads that are removed of the graded bushing, going until the measuring equipment. To minimize that opening risk of "tap", monitoring systems in real time are equipped with an alarm system that indicates that "tap" can be in open. That system bases on own measuring of the escape chain, being emitted the case alarm the value of the current measure falls below an inferior limit programmed. In the case of "tap" opening, the measure escape chain will fall to zero, being then emitted the alarm. It occurs that, also in desenergizing case of the graded bushing the escape chain falls to zero, so that that system presets the disadvantage of emitting false opening alarms of "tap" in case of desenergizing of the graded bushing.

OF THE NEW INVENTION

Thinking of inconvenient above mentioned, the inventor, person acting in the electric power sector, has created the present system that becomes more reliable the monitoring in real time of capacitance graded bushings of several equipment among them the power transformers; the power reactors; the chain transformers; circuit breakers and similar, supplying the current deficiencies with regard to the inconvenient fully illustrated in the state of the technique, system that based on a capacitive "tap" for each graded bushing, to which join a "tap adapter that then it is connected to a measuring module that receives the signals in real time coming of capacitive "tap" of three graded bushings (triphase). Thus, one or more measuring modules can connect to an only module of interface man-machine by means of serial communication, generating a modular system.

OF THE ADVANTAGES OF THE NEW INVENTION

The proposed system provides a modular structure that facilitates future expansions simply by the new modules addition, without changing already existing modules, being the interface module passible of being used of a shared form;

In the case of monophase transformers banks, monitoring system enables the programming of initial values and alarm values not only for the three graded bushings of the units in normal operation, but also for the graded bushing of the reserve phase;

The system presents the innovative function that simplifies and reduces time to make the alarms fittings, since the user have not to calculate these values manually anymore and the number of fittings was reduced for just four instead of the number of graded bushings multiplied four;

Monitoring of state of the graded bushings based not only in the instantaneous values of capacitance and tangent delta, as well as in its evolution tendencies;

It reproduces of digital way in the graded bushings monitoring system the tensions measuring function originally performed by DPBs, allowing DPBs are left to give place to monitoring system in real time without the obligation of TPs Installation, of much more elevated cost.

Monitoring system object of this patent is equipped with a system of intelligent alarm that indicates that "tap" can be in open, however without risk of false alarms emission in case of desenergizing of the graded bushings.

Figure 2:
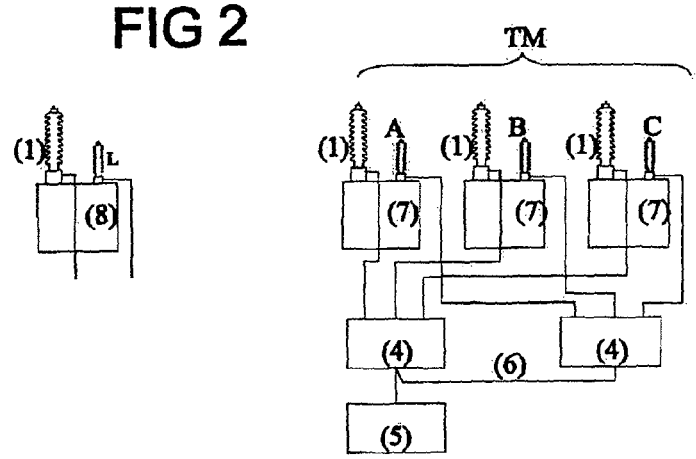
Figure 3:
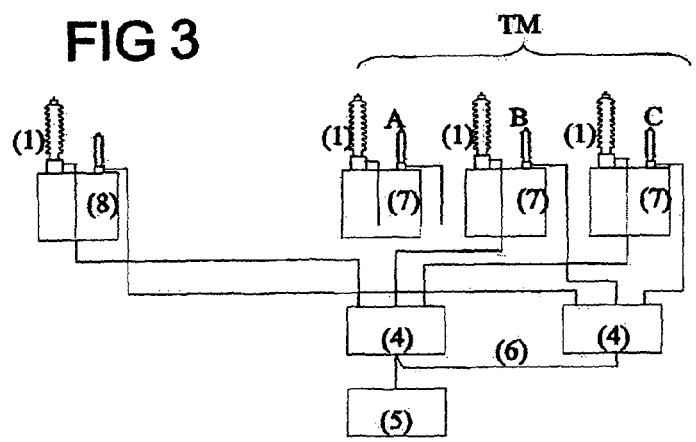

To follow, the invention will be more very explained through the related drawings below:

FIG. 1: Diagram of the proposed monitoring system of graded bushings;

FIG. 2: Schematic of the proposed monitoring system of graded bushings, showing the monitoring in real time in monophase transformer banks with reserve transformer out of operation;

FIG. 3: Schematic of the proposed monitoring system of graded bushings, showing the monitoring in real time in monophase transformer banks with reserve transformer in operation in the place of the phase transformer A.

DETAILED DESCRIPTION

"MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", object of this Patent of Invention solicitation, it is applied preferentially for power transformers; power reactors; chain transformers, circuit breakers and similar, being a system passible of accomplish the monitoring in real time of capacitance graded bushings (1), each one provided with a capacitive "tap" (2) to which it is connected a "tap" adapter (3) that, then it connects to a measuring module (4) which receives signals coming from capacitive "tap" (2) of three graded bushings (1) which form a triphase group. One or more measuring modules (4) can connect to an only module of interface man-machine (5), by means of a serial communication (6), forming a modular system passible of extension for modules of additional measuring (MA).

FIG. 2 illustrates the application of monitoring system in real time of graded bushings in monophase equipment banks, in this case in particular, exemplified with monophase transformers (TM). The three graded bushings (1) of each phase, located in the normal monophase transformers of the phases (7) are interlinked to a same measuring module (4), connecting to each measuring module (4) a triphase group of graded bushings. The graded bushings (1) of reserve monophase transformer (8), out of operation, have no signals of their capacitive "taps" connected to none of the measuring modules. When the reserve transformer (8) has to enter in operation in the place of any of the normal transformers (7), as illustrated in the FIG. 3, capacitive "taps" of the graded bushings (1) of the reserve transformer (8) are connected to the measuring modules (4) in the place of transformer (7) which went out from operation, in this case in particular the phase transformer A.

Monitoring system object of this patent is structured of modular way, being constituted by measuring modules (4) interface modules man x machine (5). Each measuring module (4) is responsible for receiving the escape chain signals of three graded bushings (1) corresponding to a triphase system, so that the quantity of graded bushings to be monitored is determined by quantity of measuring modules (4) used. As each measuring module (4) constitutes a mechanical and electrically independent unit, future expansions of the system are just made adding new measuring modules (4), without changing already existing modules. The interface module (5) can be used of a shared way, in other words, an only interface module can be connected several measuring modules (4), so that it is not necessary to install new interface modules (5) for future expansion of the system.

In the transformer banks case composed by monophase units (7), monitoring system of this patent enables the programming of initial values and alarm values not only for the three graded bushings (1) of the units in normal operation (7), but also for the graded bushing (1) of the reserve phase (8). Thus, the data of all the graded bushings (1) passible of entrance in operation stay pre-programmed in the system and, in case of entrance in operation of the reserve unit (8) it is enough inform to the system the position (phase A, phase B, or phase C) in which the reserve unit was inserted. With this information, monitoring system:

a) It takes over automatically the initial values of capacitance and tangent delta of the reserve unit (8) in the place of same parameters of the phase that goes out from operation (7);

b) It takes over automatically the appropriated values of alarm for capacitance and high tangent delta for the reserve unit (8) in the place of same parameters of the phase that goes out from operation (7);

c) It begins automatically the learning process of the system, considering that a new graded bushing with different characteristics is entering in operation.

In the same way, when the reserve unit (8) is going out of operation and in its place returns the phase of normal operation (7), it is enough inform again the monitoring system this condition so that the process above described is reverted.

Better exemplifying, user informs the monitoring system about entrance in service of the reserve graded bushing (8) or the return of normal operation of the original graded bushing (7) through a parameter of simple programming, in which it is selected an option between next:

Phases A, B, C in operation, in other words, reserve phase out of operation;

Phases Reserve, B and C in operation, in other words, phase A out of operation, with the reserve inserted in its place;

Phases A, Reserve and C in operation, in other words, phase B out of operation, with the reserve inserted in its place.

Phases A, B and Reserve in operation, in other words, phase C out of operation, with the reserve inserted in its place.

This same parameter can be informed as well, in the case of monitoring object system of this patent, by means of entered external dry contacts (9), whose shutdown nominates to the system if the reserve graded bushing is in operation and in which position is inserted.

Monitoring system of this patent has values calculation and automatic adjustment function of alarm by capacitance and high and very high tangent deltas. This function consists in programming by user of just four percentile values, being one to alarm for high capacitance; one for very high capacitance; one for high tangent delta; one for very high tangent delta. Monitoring system turns then the initial values of capacitance and tangent delta of each graded bushing (1) individually and it adds them the mentioned percentile, obtaining thus the values for alarm of each graded bushing. This innovative function has for advantages simplify and reduce time to make the alarms fittings, since the user have not to calculate these values manually anymore and the number of fittings was reduced for only four instead of the number of graded bushings multiplied by four. Simultaneously, this new function keeps the necessary individuality of the alarm fittings for each graded bushing (1), once that the percentile fittings by user are applied about the initial values of capacitance and particular tangent delta of each graded bushing (1).

The proposed system makes the monitoring of state of graded bushings based not only in the instantaneous values of capacitance and tangent delta, but also in the evolution tendency of these same parameters of each graded bushing (1). The calculation of the capacitance evolution tendency and of the evolution tendency of the tangent delta consists in determine the increase or reduction rate regarding time, so that the evolution tendencies are given on picofarads a day and percentile a day for the capacitance and the tangent delta respectively. With base in these evolution tendencies it is calculated then the remaining times so that are reached the values of high capacitance, very high capacitance, high tangent delta and very high tangent delta, according to the formula:

$$\text{Time to reach alarm value (days)} = \frac{\text{Alarm value} - \text{Current value}}{\text{Calculated tendency}}$$

It is adjusted in the system minimum limit values, in days, so that if times projected for alarm occurrences are lower than these fittings, it is emitted alarms in advance, before even though are reached the high or very high values of the capacitance and tangent delta.

Monitoring system of this patent has the innovative function of making, for each triphase group of graded bushings (1), the digital calculation of the three line tensions and of the three phase tensions of the system to what are connected the graded bushings. This function takes advantage of monitoring system to make the measuring of the escape chain of the graded bushing and of the fact that the system knows the capacitance of the graded bushing, what it allows these tensions are calculated according to the formulas:

Phase tensions: $V_{x-n} = I_x/(2*pi*\text{frequency}*C_x)$, where:
x=phase (A, B or C)
$V_{x-n}$=phase-neutral tension of the phase x
$I_x$=value rms of the escape chain measure in tap of the graded bushing of the phase x
frequency=measure frequency of the escape chain
$C_x$=current capacitance of the phase x calculated by tgraded bushings monitor Line tensions: $V_{x-y} = \text{Root}((V_{x-n}+V_{y-n}*0,5)^2+(V_{y-n}*0,866)^2)$, where:
- x, y=phases (A, B or C)
- Vx–n=phase-neutral tension of the phase x
- Vy–n=phase-neutral tension of the phase
- Vx–y=phase-phase tension between phases x and y This innovative function has for advantage reproduce of digital form in the graded bushings monitoring system the tensions measuring function originally performed by DPBs, allowing DPBs are left to give place to monitoring system in real time without obligates installation of TP, of cost much more elevated The proposed system also allows for each graded bushing (1), the generation of an exit signal in alternated tension that reproduces the phase-neutral tension with which is energized each graded bushing (1), simulating thus the operation and the signal of a DPB, in module and in phase. That exit signal is generated from the integration of the instantaneous values of the current capacitive present in "tap" of the graded bushing as the formula:

$$\text{Phase tension: } Vx\text{–}n(t) = (1/Cx) * \text{Integral}(Ix(t)*dt),$$

where:
- x=phase (The, B or C)
- $Vx\text{–}n(t)$=instantaneous phase-neutral tension of the phase x
- $Ix(t)$=instantaneous value of the measure escape chain in tap of the graded bushing of the phase x
- Cx=current capacitance of the phase x calculated by the graded bushings monitor This innovative function has for advantage allow DPBs are left to give place to monitoring system in real time without obligates installation of TPs, of more elevated cost.

As above described, during the operation of the graded bushing (1), when this is energized, in most cases is compulsory that its capacitive "tap" is landed. To minimize that risk, monitoring system object of this patent is equipped with a system of intelligent alarm that indicates that "tap" can be in open, however without risk of emission of false alarms in desenergizing case of the graded bushings. Such system bases on escape chains measuring of the graded bushings, emitting alarm in case of the value of the escape chains of just one or two graded bushings falls to less than a inferior limit programmed. In case of the escape chains of the three graded bushings fall to zero simultaneously, the system does not emit alarm, considering that the probability of "taps" of the three graded bushings are in open simultaneously is practically zero, what indicates that the real cause of the low escape currents is the desenergizing of the system, which always occurs simultaneously in the three phases.

The invention claimed is:

1. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", characterized by a monitoring system in real time of the capacitance and tangent delta of capacitance graded bushings, composite for measuring modules (4), to which it is connect capacitive taps (2) of the graded bushings (1) through tap adapters (3), in order to make the measuring of the escape chains of the graded bushings (1) and with that calculate the capacitance and the tangent delta of the graded bushings (1).

2. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 1, characterized by monitoring system object of this patent is structured of a modular way, being constituted by Measuring Modules (4) and Interface Man-Machine Modules (5).

3. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 2, characterized by monitoring system object of this patent is structured of a modular way, being each measuring module (4) responsible for receiving the escape chain signals of three graded bushings (1) corresponding to a triphase system, so that the quantity of graded bushings to be monitored is determined by quantity of used measuring modules (4).

4. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 3, characterized by each measuring module (4) constitutes a mechanical and electrically independent unit, so that future expansions of the system are just made adding new measuring modules (4), without changing already existing modules.

5. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 4, characterized by the interface module (5) to be used of a shared way, in other words, an only interface module can be connected through the serial communication (6) to several measuring modules (4), so that it is not necessary to install new interface module for future expansions of the system.

6. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 1, characterized by in the case of transformer banks composed by monophase unit (7), monitoring system object of this patent enables the programming of initial values and alarm values not only for the three graded bushings (1) of the units in normal operation (7), but also for the graded bushings (1) of the reserve phase (8).

7. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 6, characterized by the data of all the graded bushings (1) passible of entrance in operation stay pre-programmed in the system, and in case of entrance in operation of the reserve unit (8) it is enough informing to the system the position (phase A, B or C) in which the reserve unit (8) was inserted.

8. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 7, characterized by with the information of the position (phase A, B or C) in which the reserve unit (8) was inserted, monitoring system:

It takes over automatically the initial values of capacitance and tangent delta of the reserve unit (8) in the place of same parameters of the phase that goes out from operation (7);

It takes over automatically the appropriated values of alarm for capacitance and high tangent delta for the reserve unit (8) in the place of same parameters of the phase that goes out from operation (7);

It begins automatically the learning process of the system, considering that a new graded bushing with different characteristics is entering in operation.

9. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 8, characterized by when the reserve unit (8) is going out of operation and in its place is return the phase of normal operation (7), it is enough inform again to monitoring system this condition so that the process described in claim 8 is reverted.

10. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 9, characterized by user inform to the monitoring system the entrance in service of the reserve graded bushing (8) or the return to the normal operation of the original graded bushing (7) through a parameter of simple programming, in which it is selected an option between next:

Phases A, B, C in operation, in other words, reserve phase out of operation;

Phases Reserve, B and C in operation, in other words, phase A out of operation, with the reserve inserted in its place;

Phases A, Reserve and C in operation, in other words, phase B out of operation, with the reserve inserted in its place.

Phases A, B and Reserve in operation, in other words, phase C out of operation, with the reserve inserted in its place.

11. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 10, characterized by this same parameter can be also informed through entered external dry contacts (9), whose shutdown nominates to the system if the reserve graded bushing is in operation and in which position is inserted.

12. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 1, characterized by monitoring object system of this patent has values calculation and automatic adjustment function of alarm for capacitances and high and very high tangent deltas.

13. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 12, characterized by alarms automatic adjustment function consist in the programming by user of just four percentile values of alarm, one for high capacitance, one for very high capacitance, one for high tangent delta and one for very high tangent delta.

14. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 13, characterized by monitoring system takes the initial values of individual capacitance and tangent delta of each graded bushing (1) and to add them the mentioned percentile, obtaining thus the ideal values of alarm for each graded bushing, simplifying and reducing time to make the alarms adjustment, since user has not to calculate these values manually anymore and the number of fittings was reduced for just four to the opposite of the number of graded bushings multiplied by four, while it keeps the necessary individuality of the alarm fittings for each graded bushing (1).

15. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 1, characterized by monitoring system object of this patent makes the monitoring of state of the graded bushings based not only in the instantaneous values of capacitance and tangent delta, but also in the evolution tendency of these same parameters of each graded bushing (1).

16. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 15, characterized by the calculation of the capacitance evolution tendency and of the evolution tendency of the tangent delta consisted in determining the increase or reduction rate regarding time, so that the evolution tendencies are given, for instance, in picofarads a day and percentile a day for the capacitance and the tangent delta respectively.

17. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 16, characterized by with base in these evolution tendencies are calculated the remaining times so that the values of high capacitance, very high capacitance, high tangent delta and very high tangent delta are reached, according to the generic formula:

$$\text{Time to reach alarm value (days)} = \frac{\text{Alarm value} - \text{Current value}}{\text{Calculated tendency}}.$$

18. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR", according to claim 17, characterized for being adjusted in the system minimum limit values, in days, so that if times projected for the alarms occurrence are lower than these fittings, it is emitted alarms in advance, before even though are reached the high or very high values of the capacitances and tangent deltas.

19. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 1, characterized by monitoring system makes, for each triphase group of graded bushings (1), the digital calculation of three line tensions and of three phase tensions of the system to what are connected the graded bushings, profiting by monitoring system makes the measuring of the escape chain of the graded bushing and of the fact that the system knows the capacitance of the graded bushing, what it allows these tensions to be calculated according to the formulas:

$$\text{Phase tensions: } Vx\text{-}n = Ix/(2*pi*\text{frequency}*Cx),$$

where:
- x=phase (A, B or C)
- Vx-n=phase-neutral tension of the phase x
- Ix=value rms of the escape chain measure in tap of the graded bushing of the phase x
- frequency=measure frequency of the escape chain
- Cx=current capacitance of the phase x calculated by tgraded bushings monitor $$\text{Line tensions: } Vx\text{-}y = \text{Root}((Vx\text{-}n+Vy\text{-}n*0,5)^2 + (Vy\text{-}n*0,866)^2),$$

where:
- x, y=phases (A, B or C)
- Vx-n=phase-neutral tension of the phase x
- Vy-n=phase-neutral tension of the phase
- Vx-y=phase-phase tension between phases x and y.

20. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 1, characterized by monitoring system allows, for each graded bushing (1), the generation of an exit signal in alternated tension that reproduces the phase-neutral tension with which is energized each graded bushing (1), simulating thus the operation and the exit signal of a Graded bushing Potential Device, in module and in phase, being that signal of generated exit from the integration of the instantaneous values of the capacitive current present in tap of the graded bushing, as the formula:

$$\text{Phase tension: } Vx\text{-}n(t) = (1/Cx)*\text{Integral}(Ix(t)*dt),$$

where:
- x=phase (The, B or C)
- Vx-n(t)=instantaneous phase-neutral tension of the phase x
- Ix(t)=instantaneous value of the measure escape chain in tap of the graded bushing of the phase x
- Cx=current capacitance of the phase x calculated by the graded bushings monitor.

21. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 20, characterized for reproducing in the graded bushings monitoring system the measuring module and tension phases functions originally performed by the Devices of Graded Bushing Potential (DPB), allowing DPBs are left to give place to monitoring on-line system without obliges installation of TPs, of cost much more elevated.

22. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 1, characterized for having a system of intelligent alarm that indicates that capacitive tap of the graded bushing can be in open, however without risk of emission of false alarms in case of desenergizing of the graded bushings.

23. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 22, characterized by intelligent alarm system bases in the measuring of the escape chains of the graded bushings, emitting alarm in case of the value of the escape chains of just one or two belonging graded bushings to the same triphase groups fall less to a inferior programmed limit.

24. "MONITORING SYSTEM IN REAL TIME OF THE STATE OF CAPACITANCE GRADED BUSHINGS OF POWER TRANSFORMERS, POWER REACTORS, CURRENT TRANSFORMERS, CIRCUIT BREAKERS AND SIMILAR" according to claim 23, characterized by intelligent alarm system to not emit false alarm in case of the escape chains of the three graded bushings belonging to the same triphase group fall to zero simultaneously, considering that the probability of taps of the three graded bushings are in open simultaneously is practically zero, what it indicates that the real cause of the low escape chains is the desenergizing of the system, which always occurs simultaneously in the three phases.

* * * * *